(12) United States Patent
Yang et al.

(10) Patent No.: US 8,854,098 B2
(45) Date of Patent: Oct. 7, 2014

(54) SYSTEM FOR I-Q PHASE MISMATCH DETECTION AND CORRECTION

(75) Inventors: Jeongsik Yang, Cupertino, CA (US); Chan Hong Park, San Jose, CA (US); Sang-oh Lee, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 525 days.

(21) Appl. No.: 13/011,716

(22) Filed: Jan. 21, 2011

(65) Prior Publication Data

US 2012/0187994 A1     Jul. 26, 2012

(51) Int. Cl.
| | |
|---|---|
| H03H 11/16 | (2006.01) |
| H03D 7/14 | (2006.01) |
| H03D 7/16 | (2006.01) |
| H03L 7/081 | (2006.01) |
| H04L 27/36 | (2006.01) |
| H04L 27/38 | (2006.01) |

(52) U.S. Cl.
CPC .......... *H04L 27/3863* (2013.01); *H03D 7/1441* (2013.01); *H03D 7/165* (2013.01); *H03D 7/1458* (2013.01); *H03L 7/0812* (2013.01); *H04L 27/368* (2013.01)
USPC .......................................... 327/233; 327/238

(58) Field of Classification Search
None
See application file for complete search history.

(56) References Cited

U.S. PATENT DOCUMENTS

| | | | |
|---|---|---|---|
| 4,061,882 A | 12/1977 | Dorren | |
| 4,333,020 A | 6/1982 | Maeder | |
| 4,555,777 A | 11/1985 | Poteet | |
| 4,623,801 A | 11/1986 | Rocchi | |
| 4,716,320 A | 12/1987 | McAdams | |
| 4,959,557 A | 9/1990 | Miller | |
| 4,995,589 A | 2/1991 | Adishian et al. | |
| 5,097,157 A | 3/1992 | Jaffe et al. | |
| 5,103,114 A | 4/1992 | Fitch | |
| 5,103,116 A | 4/1992 | Sivilotti et al. | |
| 5,103,144 A | 4/1992 | Dunham | |
| 5,192,875 A | 3/1993 | Kielmeyer, Jr. | |
| 5,375,258 A | 12/1994 | Gillig | |
| 5,477,180 A | 12/1995 | Chen | |
| 5,534,803 A | 7/1996 | Correale, Jr. et al. | |

(Continued)

FOREIGN PATENT DOCUMENTS

| | | |
|---|---|---|
| CN | 1412947 A | 4/2003 |
| CN | 1904773 A | 1/2007 |

(Continued)

OTHER PUBLICATIONS

Chan, et al., "Hercules (RTR9800) Divider", Aug. 2005.

(Continued)

*Primary Examiner* — Cassandra Cox (74) *Attorney, Agent, or Firm* — Ramin Mobarhan (57) ABSTRACT

System for I-Q phase mismatch detection and correction. An apparatus to correct a phase mismatch between I and Q signals includes a correction circuit configured to continuously compare a reference signal and a phase error signal associated with the I and Q signals to generate an I bias signal and a Q bias signal, a first CMOS buffer configured to receive the I signal and the I bias signal and output a phase adjusted I signal based on the I bias signal, and a second CMOS buffer configured to receive the Q signal and the Q bias signal and output a phase adjusted Q signal based on the Q bias signal.

30 Claims, 6 Drawing Sheets

(56) References Cited

U.S. PATENT DOCUMENTS

| | | | |
|---|---|---|---|
| 5,682,109 A | 10/1997 | Ohmi et al. |
| 5,708,399 A | 1/1998 | Fujii et al. |
| 5,983,082 A | 11/1999 | Hilbert |
| 5,994,935 A | 11/1999 | Ueda et al. |
| 6,014,047 A | 1/2000 | Dreps et al. |
| 6,037,816 A | 3/2000 | Yamauchi |
| 6,057,823 A | 5/2000 | Aoki et al. |
| 6,166,571 A | 12/2000 | Wang |
| 6,169,434 B1 | 1/2001 | Portmann |
| 6,188,291 B1 | 2/2001 | Gopinathan et al. |
| 6,191,629 B1 | 2/2001 | Bisanti et al. |
| 6,239,640 B1 | 5/2001 | Liao et al. |
| 6,310,501 B1 | 10/2001 | Yamashita |
| 6,316,987 B1 | 11/2001 | Dally et al. |
| 6,320,418 B1 | 11/2001 | Fujii et al. |
| 6,320,438 B1 | 11/2001 | Arcus |
| 6,420,921 B1 | 7/2002 | Okayasu et al. |
| 6,426,660 B1 | 7/2002 | Ho et al. |
| 6,433,589 B1 | 8/2002 | Lee |
| 6,542,015 B2 | 4/2003 | Zhou et al. |
| 6,593,789 B2 | 7/2003 | Atallah et al. |
| 6,661,269 B2 | 12/2003 | Simon et al. |
| 6,667,703 B1 | 12/2003 | Reuveni et al. |
| 6,674,772 B1 | 1/2004 | Dally et al. |
| 6,831,497 B2 | 12/2004 | Koh et al. |
| 6,836,240 B1 | 12/2004 | Dubbert et al. |
| 6,897,696 B2 | 5/2005 | Chang |
| 6,904,538 B2 | 6/2005 | Glas et al. |
| 6,933,759 B1 | 8/2005 | Wu et al. |
| 6,967,514 B2 | 11/2005 | Kizer et al. |
| 7,027,793 B2 | 4/2006 | Gard et al. |
| 7,075,377 B2 | 7/2006 | Metaxakis |
| 7,099,643 B2 | 8/2006 | Lin |
| 7,110,469 B2 | 9/2006 | Shi et al. |
| 7,184,512 B2 | 2/2007 | Takeshita et al. |
| 7,239,209 B2 | 7/2007 | Adan |
| 7,271,622 B2 | 9/2007 | Metaxakis |
| 7,298,222 B2 | 11/2007 | Rosik et al. |
| 7,307,461 B2 | 12/2007 | Nguyen et al. |
| 7,315,220 B1 | 1/2008 | Robinson et al. |
| 7,323,944 B1 | 1/2008 | Florescu et al. |
| 7,336,114 B2 | 2/2008 | Razavi et al. |
| 7,352,229 B1 | 4/2008 | Mei et al. |
| 7,388,416 B2 | 6/2008 | Marutani |
| 7,423,468 B2 | 9/2008 | Cho |
| 7,457,605 B2 | 11/2008 | Thompson et al. |
| 7,474,715 B1 | 1/2009 | Ni et al. |
| 7,521,976 B1 | 4/2009 | Sudjian et al. |
| 7,545,230 B2 | 6/2009 | Jang et al. |
| 7,554,380 B2 | 6/2009 | Embabi et al. |
| 7,580,483 B2 | 8/2009 | Ibrahim et al. |
| 7,603,094 B2 | 10/2009 | Rahman et al. |
| 7,616,938 B2 | 11/2009 | Behzad et al. |
| 7,619,456 B2 | 11/2009 | Kim et al. |
| 7,656,205 B2 | 2/2010 | Chen et al. |
| 7,683,682 B1 | 3/2010 | Won et al. |
| 7,693,230 B2 | 4/2010 | Sorrells et al. |
| 7,715,836 B2 | 5/2010 | Vassiliou et al. |
| 7,750,708 B2 | 7/2010 | Gschier |
| 7,750,749 B2 | 7/2010 | Jones |
| 7,768,330 B2 | 8/2010 | Yuuki et al. |
| 7,808,329 B2 | 10/2010 | Azadet et al. |
| 7,821,315 B2 | 10/2010 | Bossu et al. |
| 7,932,844 B1 | 4/2011 | Huynh et al. |
| 7,965,111 B2 | 6/2011 | Sun et al. |
| 8,095,103 B2 | 1/2012 | Asuri |
| 8,164,361 B2 | 4/2012 | Soltanian et al. |
| 8,248,132 B2* | 8/2012 | Chang ........................ 327/238 |
| 2001/0050583 A1 | 12/2001 | Fulkerson |
| 2002/0000834 A1 | 1/2002 | Ooishi |
| 2002/0079938 A1 | 6/2002 | Saeki |
| 2002/0113270 A1 | 8/2002 | Bernstein et al. |
| 2002/0160740 A1 | 10/2002 | Hatcher et al. |
| 2003/0042957 A1 | 3/2003 | Tamura |
| 2003/0042989 A1 | 3/2003 | Sakurai |
| 2003/0102926 A1 | 6/2003 | Hsieh |
| 2004/0008092 A1 | 1/2004 | Hajimiri et al. |
| 2004/0036541 A1 | 2/2004 | Fang et al. |
| 2004/0051397 A1 | 3/2004 | Juntunen et al. |
| 2004/0147238 A1 | 7/2004 | Wang et al. |
| 2004/0212741 A1 | 10/2004 | Hijikata et al. |
| 2005/0024097 A1 | 2/2005 | Sim et al. |
| 2005/0046494 A1 | 3/2005 | Lee et al. |
| 2005/0122149 A1 | 6/2005 | Cho et al. |
| 2005/0174157 A1 | 8/2005 | Calo et al. |
| 2006/0035617 A1 | 2/2006 | Kim |
| 2006/0059376 A1 | 3/2006 | Ngo et al. |
| 2006/0067424 A1 | 3/2006 | Wolf |
| 2006/0119446 A1 | 6/2006 | Li et al. |
| 2007/0037544 A1 | 2/2007 | Heikkinen |
| 2007/0076832 A1 | 4/2007 | Matsudera |
| 2007/0239319 A1 | 10/2007 | Inukai et al. |
| 2007/0242548 A1 | 10/2007 | Tonti et al. |
| 2007/0257742 A1 | 11/2007 | Cha et al. |
| 2007/0273485 A1 | 11/2007 | Balachandran et al. |
| 2007/0285120 A1 | 12/2007 | Venditti et al. |
| 2008/0001645 A1 | 1/2008 | Kuroki |
| 2008/0032646 A1 | 2/2008 | Huang et al. |
| 2008/0048736 A1 | 2/2008 | Ruy |
| 2008/0061894 A1 | 3/2008 | Raita et al. |
| 2008/0074148 A1 | 3/2008 | Srivastava et al. |
| 2008/0096508 A1 | 4/2008 | Luff |
| 2008/0106313 A1 | 5/2008 | Keady et al. |
| 2008/0116902 A1 | 5/2008 | Kim et al. |
| 2008/0132195 A1* | 6/2008 | Maxim et al. ................. 455/334 |
| 2008/0180139 A1 | 7/2008 | Natonio et al. |
| 2008/0225169 A1 | 9/2008 | Takita et al. |
| 2008/0231379 A1 | 9/2008 | Jang et al. |
| 2008/0258781 A1 | 10/2008 | Song et al. |
| 2009/0033430 A1 | 2/2009 | Jang et al. |
| 2009/0066157 A1 | 3/2009 | Tarng et al. |
| 2009/0102520 A1 | 4/2009 | Lee et al. |
| 2009/0108885 A1 | 4/2009 | Natonio et al. |
| 2009/0131006 A1 | 5/2009 | Wu |
| 2009/0154595 A1 | 6/2009 | Choksi et al. |
| 2009/0156135 A1 | 6/2009 | Kamizuma et al. |
| 2009/0184741 A1 | 7/2009 | Suda et al. |
| 2009/0256596 A1 | 10/2009 | Oh |
| 2009/0284288 A1 | 11/2009 | Zhang et al. |
| 2009/0284311 A1 | 11/2009 | Ito |
| 2009/0310711 A1* | 12/2009 | Chiu et al. ..................... 375/302 |
| 2010/0012648 A1 | 1/2010 | Gustafsson et al. |
| 2010/0120390 A1* | 5/2010 | Panikkath et al. ............. 455/208 |
| 2010/0130139 A1 | 5/2010 | Panikkath et al. |
| 2010/0194485 A1 | 8/2010 | Chawla et al. |
| 2010/0198540 A1* | 8/2010 | Yanagisawa et al. ............ 702/71 |
| 2010/0226459 A1* | 9/2010 | Park et al. ..................... 375/298 |
| 2011/0001522 A1 | 1/2011 | Chan et al. |
| 2011/0012648 A1 | 1/2011 | Qiao et al. |
| 2011/0043291 A1 | 2/2011 | Fagg |
| 2011/0050296 A1 | 3/2011 | Fagg |
| 2011/0181330 A1 | 7/2011 | Oh |
| 2013/0012150 A1 | 1/2013 | Panikkath et al. |
| 2013/0271188 A1 | 10/2013 | Chan |
| 2013/0328707 A1 | 12/2013 | Choksi et al. |
| 2013/0336143 A1 | 12/2013 | Choksi et al. |

FOREIGN PATENT DOCUMENTS

| | | |
|---|---|---|
| EP | 0398751 A2 | 11/1990 |
| EP | 0637134 A1 | 2/1995 |
| EP | 0872956 A2 | 10/1998 |
| EP | 1345317 A2 | 9/2003 |
| EP | 1394944 | 3/2004 |
| EP | 1416691 A1 | 5/2004 |
| EP | 1655591 A1 | 5/2006 |
| EP | 1679796 A1 | 7/2006 |
| FR | 2670975 A1 | 6/1992 |
| GB | 2321144 A | 7/1998 |
| JP | 53048401 A | 5/1978 |
| JP | 59008112 A | 1/1984 |
| JP | 62141219 U | 9/1987 |
| JP | 63078610 A | 4/1988 |
| JP | H0194723 A | 4/1989 |

(56) References Cited

FOREIGN PATENT DOCUMENTS

| | | | |
|---|---|---|---|
| JP | H01314013 A | 12/1989 |
| JP | 2058951 A | 2/1990 |
| JP | 2060330 U | 5/1990 |
| JP | 2131615 A | 5/1990 |
| JP | H03262317 A | 11/1991 |
| JP | H04152711 A | 5/1992 |
| JP | H05235746 A | 9/1993 |
| JP | 5268000 A | 10/1993 |
| JP | 7170162 A | 7/1995 |
| JP | 9046195 A | 2/1997 |
| JP | 9191238 A | 7/1997 |
| JP | H09284125 A | 10/1997 |
| JP | 10111674 A | 4/1998 |
| JP | 10247842 A | 9/1998 |
| JP | H11298077 A | 10/1999 |
| JP | 2000295090 A | 10/2000 |
| JP | 2000332583 A | 11/2000 |
| JP | 2001245007 A | 9/2001 |
| JP | 2001312328 A | 11/2001 |
| JP | 2001313228 A | 11/2001 |
| JP | 2002043900 A | 2/2002 |
| JP | 2002064367 A | 2/2002 |
| JP | 2003101397 A | 4/2003 |
| JP | 2003512752 A | 4/2003 |
| JP | 2003224471 A | 8/2003 |
| JP | 2004129255 A | 4/2004 |
| JP | 2004531126 A | 10/2004 |
| JP | 2004336822 A | 11/2004 |
| JP | 2005110080 A | 4/2005 |
| JP | 2006093748 A | 4/2006 |
| JP | 2006115148 A | 4/2006 |
| JP | 2006173897 A | 6/2006 |
| JP | 2006217563 A | 8/2006 |
| JP | 2006287819 A | 10/2006 |
| JP | 2006314029 A | 11/2006 |
| JP | 2007102483 A | 4/2007 |
| JP | 2008029008 A | 2/2008 |
| JP | 2008054134 A | 3/2008 |
| JP | 2008124836 A | 5/2008 |
| JP | 2010003925 A | 1/2010 |
| KR | 20050055925 A | 6/2005 |
| KR | 100791934 B1 | 1/2008 |
| KR | 20080019156 A | 3/2008 |
| TW | 200305312 A | 10/2003 |
| TW | 200529566 | 9/2005 |
| TW | 200723676 | 6/2007 |
| TW | I283515 B | 7/2007 |
| WO | 9621270 | 7/1996 |
| WO | WO9912259 A2 | 3/1999 |
| WO | WO0129965 A1 | 4/2001 |
| WO | WO0251091 A1 | 6/2002 |
| WO | WO-02052691 A1 | 7/2002 |
| WO | 2004047324 A1 | 6/2004 |
| WO | WO2006033203 A1 | 3/2006 |
| WO | WO2009036397 | 3/2009 |
| WO | WO2009036399 | 3/2009 |
| WO | WO2010068504 | 6/2010 |

OTHER PUBLICATIONS

Chan, "Hercules (RTR8700) Divider", Aug. 2005.
Navid S et al., "Level-Locked Loop: A Technique for Broadband Quadrature Signal Generation", Custom Integrated Circuits Conference, 1997., Proceedings of the IEEE 1997 Santa Clara, CA, USA May 5-8, 1997, New York, NY, USA,IEEE, US, May 5, 1997, pp. 411-414, XP010235334, DOI: 10.1109/CICC.1997.606656 ISBN: 978-0-7803-3669-8.
Taiwan Search Report—TW097149468—TIPO—Mar. 21, 2012.
Roufoogaran, R. et al.; "A Compact and Power Efficient Local Oscillator Generation and Distribution System for Complex Multi Radio Systems", Radio Frequency Integrated Circuits Symposium, 2008. RFIC 2008. IEEE, Digital Object Identifier: 10.1109/RFIC.2008. 4561435, Publication Year: 2008 , pp. 277-280.
Fuse, T et al: "A 1.1V SOI CMOS Frequency Divider Using Body-Inputting SCL Circuit Technology", 2000 IEEE International SOI Conference Proceedings. Wakefield, MA, Oct. 2-5, 2000; [IEEE International SOI Conference], New York, NY : IEEE, US, Oct. 2, 2000, p. 106/107, XP001003452, ISBN: 978-0-7803-6390-8 p. 106; figure 3.
International Search Report and Written Opinion—PCT/US2012/022116—ISA/EPO—Apr. 12, 2012.
Lee, T.H., et al., "A 2.5 V CMOS delay-locked loop for 18 Mbit, 500 megabyte/s DRAM," Solid-State Circuits, IEEE Journal of, vol. 29, No. 12, pp. 1491-1496, Dec. 1994.

* cited by examiner

SYSTEM FOR I-Q PHASE MISMATCH DETECTION AND CORRECTION

BACKGROUND

1. Field

The present application relates generally to the operation and design of radio frequency transceivers, and more particularly, to a system for I-Q phase mismatch detection and correction.

2. Background

High quality signal transmission and reception is especially important in portable devices. Typically, such devices include a local oscillator (LO) to generate in-phase (I) and quadrature phase (Q) signals that are designed to have a phase relationship of 90 degrees.

One problem associated with the generation of I and Q signals is I/Q mismatch, which can cause a residual side tone. There are two main types of I/Q mismatch. One is an amplitude mismatch of the I/Q signals and the second is a phase mismatch of the I/Q signals. In general, LO generated I/Q signals are less sensitive to amplitude mismatch, since the LO I/Q signals have full supply swing levels. However, the LO I/Q signals are very sensitive to I/Q phase mismatches especially in divide-by-2 LO generation architectures.

Therefore, it would be desirable to have a system that can continuously detect and correct I/Q phase mismatches in a transceiver.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

A novel system for I/Q phase-mismatch detection and correction is provided. In one implementation, XOR (exclusive-OR) logic is used to detect the phase relationship between I and Q signals. If the I/Q signals have a 90 degree phase relationship, then the XOR logic will generate a pulse train having a 50% duty cycle. The DC voltage of this pulse train after being low-pass filtered will be close to VDD/2. Comparators are used to compare this filtered voltage to a reference voltage (i.e., VDD/2) to generate the appropriate bias signals to control I and Q CMOS buffers to adjust the phase relationship of the I and Q signals. This feedback process continues to maintain an exact 90 degree I/Q phase relationship.

Figure 1:
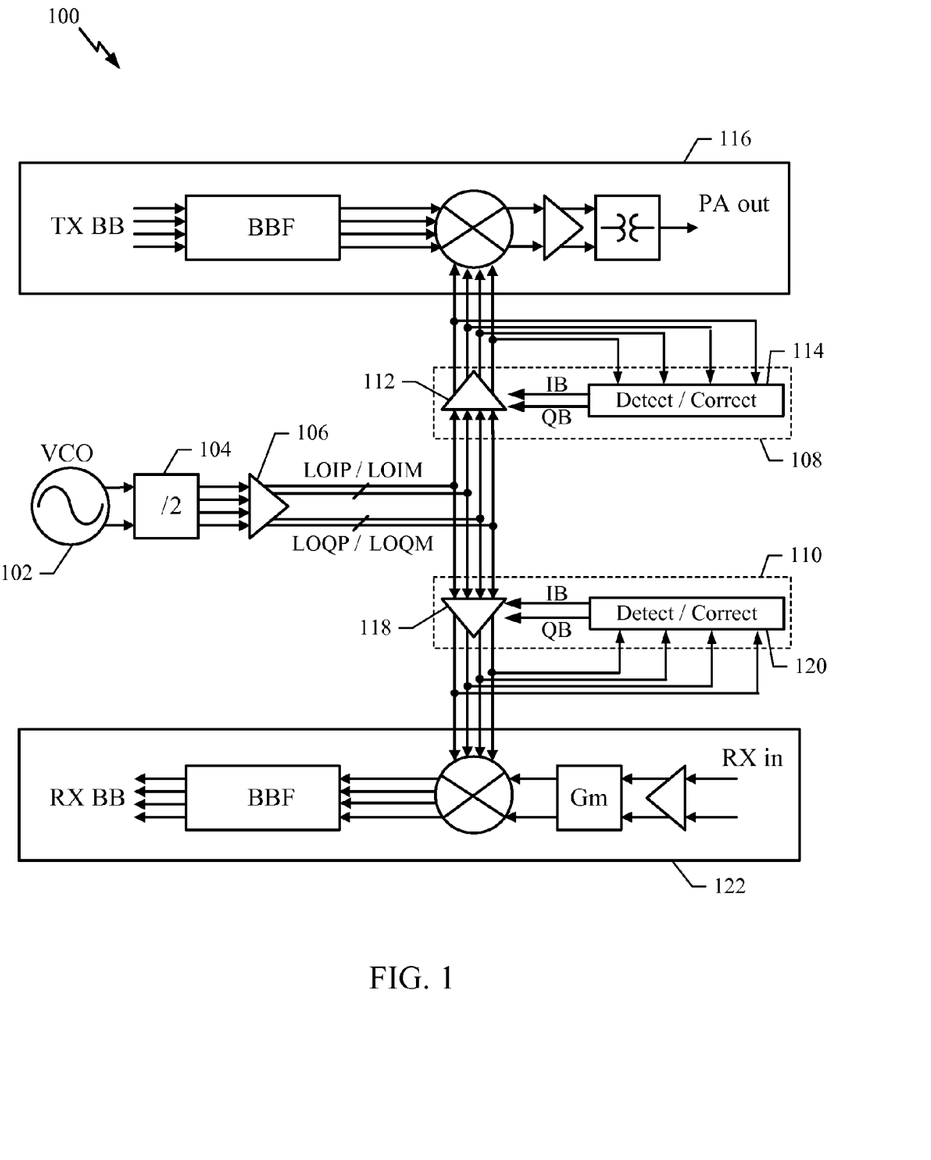
FIG. 1 shows exemplary phase correction modules in an RF transceiver architecture.

FIG. 1 shows exemplary phase correction modules in an RF transceiver 100. The transceiver 100 is suitable for use in a variety of communication devices. The transceiver 100 comprises a voltage controlled oscillator 102, a divide-by-2 circuit 104, driver buffer 106, TX phase correction module 108, and RX phase correction module 110.

The TX phase correction module 108 comprises TX LO buffer 112 and detection/correction circuit 114. The output of the TX LO buffer 112 is coupled to a transmitter 116. The RX phase correction module 110 comprises RX LO buffer 118 and detection/correction circuit 120. The output of the RX LO buffer 118 is coupled to a receiver 122. It should be noted that the TX and RX phase correction modules are shown in a differential configuration and that it is also possible to configure the TX and RX phase correction modules in a single-ended configuration.

The oscillator 102 outputs PLUS (+) and MINUS (−) oscillator signals that are input to the divide-by-2 circuit 104, which produces differential I and Q phase signals for use by the transceiver 100. For example, a local oscillator I plus (LOIP) signal and a local oscillator I minus (LOIM) signal are produced. Similarly, a local oscillator Q plus (LOQP) signal and a local oscillator Q minus (LOQM) signal are produced. Thus, the transceiver 100 uses a divide-by-2 type of LO I/Q signal generation that is very simple and consumes less power than other architectures. However, this architecture is very sensitive to the duty cycle of the divide-by-2 input clock. If the duty cycle of the divide-by-2 input clock is 50%, then the phase relationship between the I and Q signals is close to 90 degrees. However, if the divide-2 input clock has a duty cycle mismatch, it will directly contribute to I/Q phase mismatch during LO I/Q signal generation. In addition to duty cycle mismatch, device mismatch and LO line mismatch also contribute I/Q phase mismatch of LO I/Q signal generation.

The TX phase correction module 108 and the RX phase correction module 110 operate to correct for phase mismatches between the I and Q signals. For example, the TX detection/correction circuit 114 and the RX detection/correction circuit 120 operate to detect for I and Q phase mismatches and generate I and Q bias signals (IB, QB) that are used to control the operation of CMOS buffers (112, 118) so that the phase mismatch between the I and Q signal can be corrected. For example, the TX phase adjusted I and Q signals output from the TX LO buffer 112 are distributed to the transmitter 116. The RX phase adjusted I and Q signals output from the RX LO buffer 118 are distributed to the receiver 122. The various phases of the I and Q signals are used at the transmitter 116 to transmit signals and at the receiver 122 to receive signals. A more detailed description of the TX phase correction module 108 and the RX phase correction module 110 are provided in another section of this document.

Figure 2:
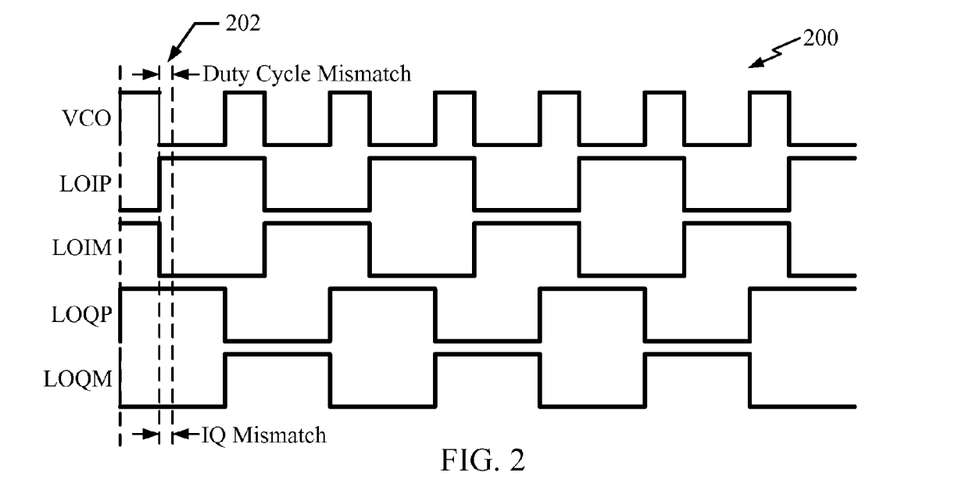
FIG. 2 shows an exemplary timing diagram illustrating phase mismatches associated with a divide-by-2 type of LO I/Q signal generation.

FIG. 2 shows an exemplary timing diagram 200 illustrating phase mismatches associated with a divide-by-2 type of LO I/Q signal generation. For example, the diagram 200 illustrates a VCO output signal having a small duty cycle mismatch shown generally at 202. This duty cycle mismatch results in phase mismatches between the signals generated by the divide-by-2 type of LO I/Q signal generation used in the transceiver of FIG. 1. For example, the rising edge of the LOIP signal shown in the diagram 200 is slightly early relative to the LOQP signal. Thus, a phase mismatch between the I and Q signals is caused as a result of the duty cycle mismatch 202.

In various implementations, the phase correction modules 108 and 110 operate to correct the phase mismatches illustrated in FIG. 2.

Figure 3:
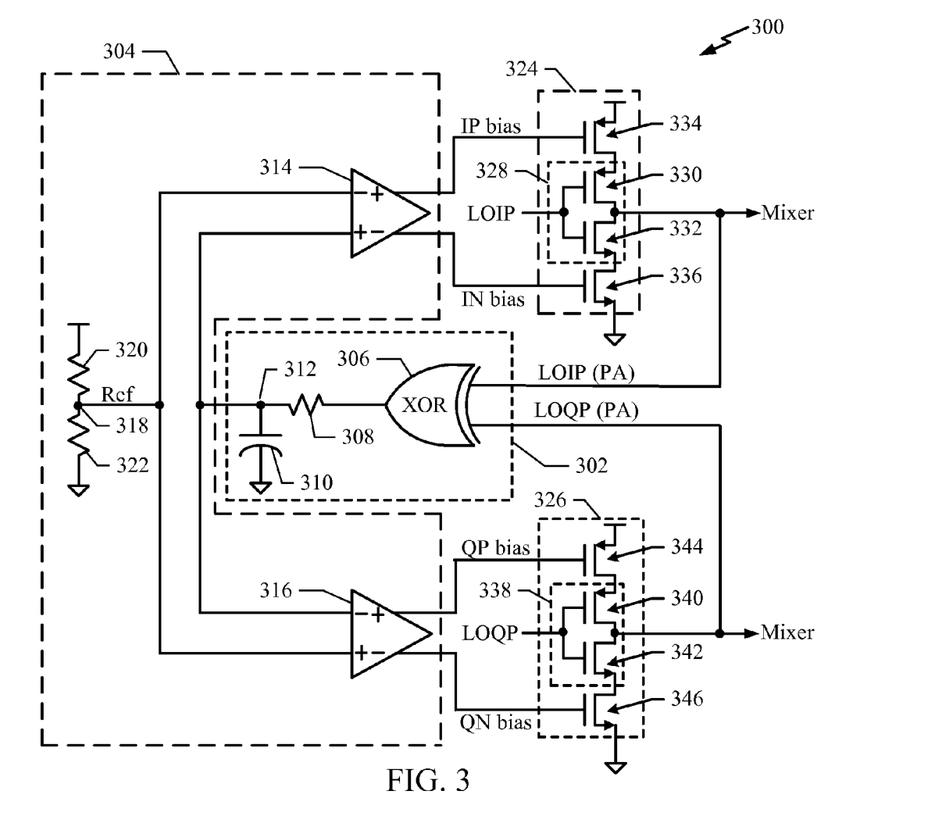
FIG. 3 shows an exemplary I/Q phase correction module.

FIG. 3 shows an exemplary phase correction module 300 that operates to provide I/Q phase mismatch detection and correction. For example, the phase correction module 300 is suitable for use as either of the phase correction modules 108 or 110 show in FIG. 1. For clarity, the phase correction module 300 is shown in a single-ended configuration but may also be modified to provide a differential configuration. For example, the module 300 is configured to detect and correct phase mismatches between LOIP and LOQP signals. It is also possible to provide a similar module to detect and correct phase mismatches between LOIM and LOQM signals as well.

The module 300 comprises CMOS buffers 324 and 326 that output a phase adjusted I plus signal (LOIP (PA)) and a phase adjusted Q plus signal (LOQP (PA)), respectively. These phase adjusted signals are input to mixer circuits of the transmitter 116 or the receiver 122 shown in FIG. 1. The CMOS buffers 324 and 326 operate to provide phase adjustment as described below.

The module 300 comprises an I/Q phase detection circuit 302 and I/Q phase correction circuit 304. The I/Q phase detection circuit 302 uses a combining circuit, such as an XOR (exclusive-OR) gate 306 to detect the phase relationship between the LOIP (PA) signal and the LOQP (PA) signal. The XOR gate 306 generates a pulse train signal having a duty cycle determined by the I/Q phase relationship. If I/Q signals have a 90 degree phase relationship, the XOR gate 306 will generate a pulse train signal having a 50% duty cycle. If I/Q signals have less than a 90 degree phase relationship, then the XOR gate 306 will generate a pulse train signal having less than a 50% duty cycle and vice versa. It should also be noted that the combining circuit is not limited to an XOR gate 306 and can therefore comprise any suitable phase detector circuit.

The pulse train signal output from the XOR gate 306 is input to a low pass filter (LPF) that comprises resistor 308 and capacitor 310. The LPF filters the pulse train signal to generate a DC voltage level error signal at node 312. The error signal at node 312 is input to comparators 314 and 316 of the I/Q phase correction circuit 304.

The comparators 314 and 316 of the I/Q phase correction circuit 304 compare the DC voltage level error signal 312 from the I/Q phase detection circuit 302 to a reference signal 318 that is generated by the resistors 320 and 322. If the resistors 320 and 322 are equal, the reference signal 318 represents one half of the supply voltage (VDD/2). If the I/Q signals have a 90 degree phase relationship, then the XOR gate 306 generates the pulse train signal with a 50% duty cycle and the LPF will generate the DC level error signal 312 to be approximately equal to VDD/2.

The comparators 314 and 316 output I and Q bias signals (that are connected to the CMOS buffers 324 and 326. The CMOS buffers 324 and 326 operate to adjust the phase relationship of the I and Q signals to correct for any phase mismatches. The CMOS buffer structure allows the TX phase correction module 108 and the RX phase correction module 110 to be constructed with low voltage, nanometer scale (65 nm, 45 nm, 28 nm) CMOS processes. The TX phase correction module 108 and the RX phase correction module 110 provide "single ended quasi differential" processing in that the CMOS buffers 324 and 326 are processing differential signals but the buffers are quasi differential because there is no biasing transistor that is shared between the buffers for the positive and negative side of the signal, and therefore can also be considered single ended circuits.

The CMOS buffer 324 includes a CMOS inverter 328 that comprises PMOS transistor 330 and NMOS transistor 332. The transistors 330 and 332 have gate terminals that are connected to receive the LOIP signal and drain terminals connected to form an output port to output the LOIP (PA) signal that is connected to the XOR gate 306 and is also coupled to the mixer of either the transmitter 116 or receiver 122 as appropriate.

The PMOS transistor 334 and the NMOS transistor 336 control the operation of the CMOS buffer 324 to adjust the phase of the LOIP signal to produce the LOIP (PA) signal. For example, the speed of the CMOS inverter 328 with respect to the rising edge of the LOIP signal is controlled by the PMOS transistor 334, which controls the amount of current that flows to the inverter 328 based on an IP bias signal output from the comparator 314. The speed of the CMOS inverter 328 with respect to the falling edge of the LOIP signal is controlled by the NMOS transistor 336, which controls the amount of current that flows from the inverter 328 based on an IN bias signal output from the comparator 314. Thus, by controlling the amount of current flowing to and from the inverter 328, the IP and IN bias signals control the speed of the rising and falling edges of the buffer output thereby providing a phase adjusted LOIP signal (i.e., LOIP (PA)). For example, when the speed of the rising and falling edges is decreased, the phase of the input LOIP signal is delayed to form the LOIP (PA) signal, and when the speed of the rising and falling edges is increased, the phase of the LOIP signal is advanced to form the LOIP (PA) signal.

Similarly, the LOQP signal is connected to CMOS buffer 326. The CMOS buffer 326 includes a CMOS inverter 338 that comprises PMOS transistor 340 and NMOS transistor 342. The transistors 340 and 342 have gate terminals that are connected to receive the LOQP signal and drain terminals connected to form an output port to output the LOQP (PA) signal.

The PMOS transistor 344 and the NMOS transistor 346 control the operation of the CMOS buffer 326 to adjust the phase of the LOQP signal to produce the LOQP (PA) signal. For example, the speed of the CMOS inverter 338 with respect to the rising edge of the LOQP signal is controlled by the PMOS transistor 344, which controls the amount of current that flows to the inverter 338 based on a QP bias signal output from the comparator 316. The speed of the CMOS inverter 338 with respect to the falling edge of the LOQP signal is controlled by the NMOS transistor 346, which controls the amount of current that flows from the inverter 338 based on a QN bias signal output from the comparator 316. Thus, by controlling the amount of current flowing to and from the inverter 338, the QP and QN bias signals control the speed of the rising and falling edges of the buffer output thereby providing a phase adjusted LOQP signal (i.e., LOQP (PA)). For example, when the speed of the rising and falling edges is decreased, the phase of the input LOQP signal is delayed to form the LOQP (PA) signal, and when the speed of the rising and falling edges is increased, the phase of the LOQP signal is advanced to form the LOQP (PA) signal.

In various implementations, the CMOS buffers 324 and 326 can be implemented with a single inverter or multiple inverters connected in a series chain. For example, each of the CMOS buffers 324 and 326 may comprise multiple inverters that are connected in series so that the output of one inverter is input to the next inverter in the chain and so forth. In this implementation, the bias signals are connected together to bias all inverters in the chain simultaneously. For example, all the IP bias signals are connected together and all the IN bias signals are connected together. This series configuration provides a greater range of adjustment to correct for large phase mismatches between the I and Q signals During operation, the comparator 314 continuously compares the DC level error signal 312 to the reference signal 318 to generate complementary IP bias and IN bias signals. The comparator 316 continuously compares the DC level error signal 312 to the reference signal 318 to generate complementary QP bias and QN bias signals. These bias signals bias the operation of their associated CMOS buffer by controlling the available current and therefore controlling the speed of the rising and falling edges of the inverter outputs. The phase adjusted signals from the inverter outputs are input to the combining circuit (i.e., XOR gate 306) to determine if there are any phase mismatches and the detection/correction process continues. As a result, phase mismatches between the LOIP and LOQP signals are continuously corrected so that a 90 degree phase relationship is maintained. Additional description of the operation of the bias signals to control the speed of the CMOS buffers 324 and 326 is provided below.

It should be noted that the system provides I/Q phase correction before the transmitter 116 and receiver 122 in FIG. 1, which allows for continuous real time correction of the I/Q phase error at the location where it has the most positive impact on performance.

Figure 4:
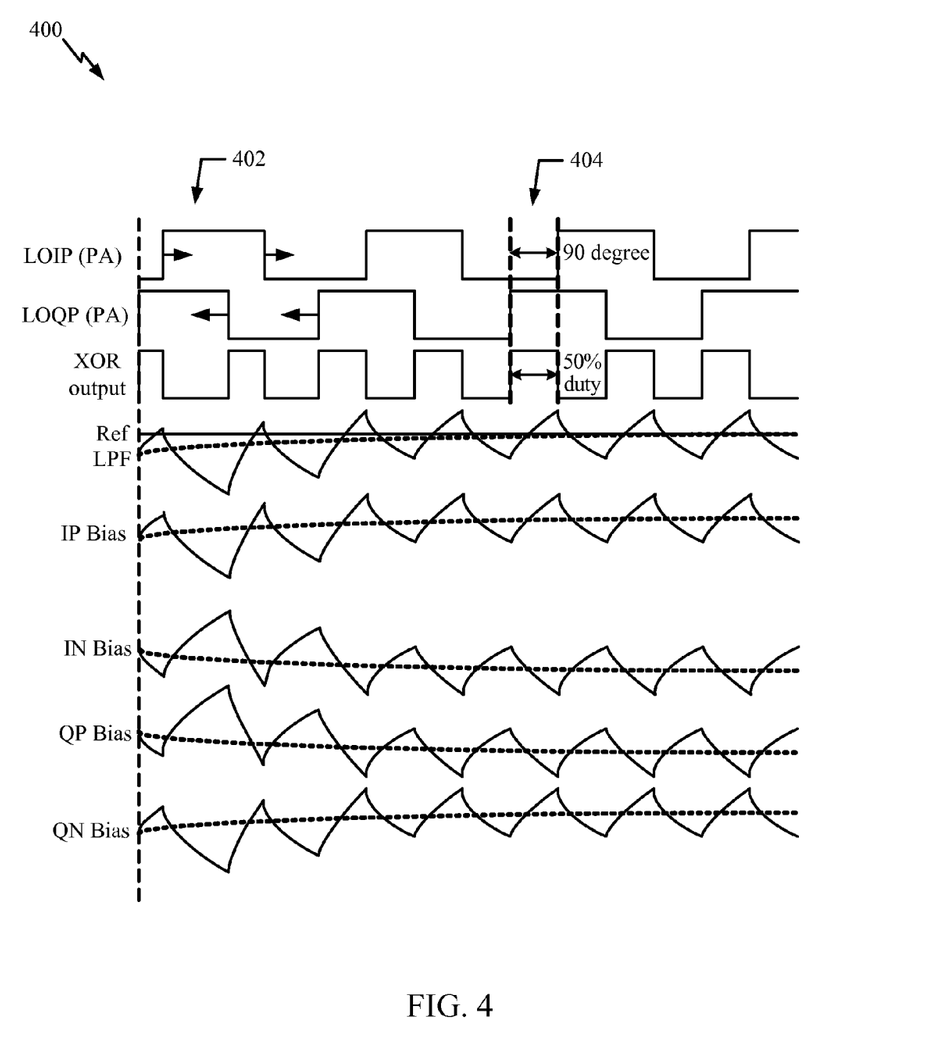
FIG. 4 shows an exemplary timing diagram illustrating the operation of the phase correction module of FIG. 3.

FIG. 4 shows an exemplary timing diagram illustrating the operation of the phase correction module 300 shown in FIG. 3. It will be assumed that during operation of the module 300, the I/Q phase relationship is less than 90 degrees and the XOR gate 306 generates a pulse train signal having less than a 50% duty cycle, as shown generally at 402. The error signal 312 output from the LPF is lower than the reference (Ref) signal 318 and this causes the comparator 314 to decrease the IN bias signal and increase the IP bias signal. Similarly, the comparator 316 operates to decrease the QP bias signal and increase the QN bias signal. These adjustments will cause the CMOS inverter 328 to operate more slowly (i.e., rising and falling edges transition more slowly) to delay the LOIP signal to produce the LOIP (PA) signal, and the CMOS inverter 338 to operate faster (i.e., rising and falling edges transition more quickly) to advance the LOQP to produce the LOQP (PA) signal. Thus, the I/Q phase relationship will be increased to 90 degrees as the XOR gate 306 outputs a pulse train signal having a duty cycle that is adjusted to 50%, as illustrated at 404. This adjustment occurs in a continuous fashion maintaining the I/Q phase relationship at 90 degrees.

Figure 5:
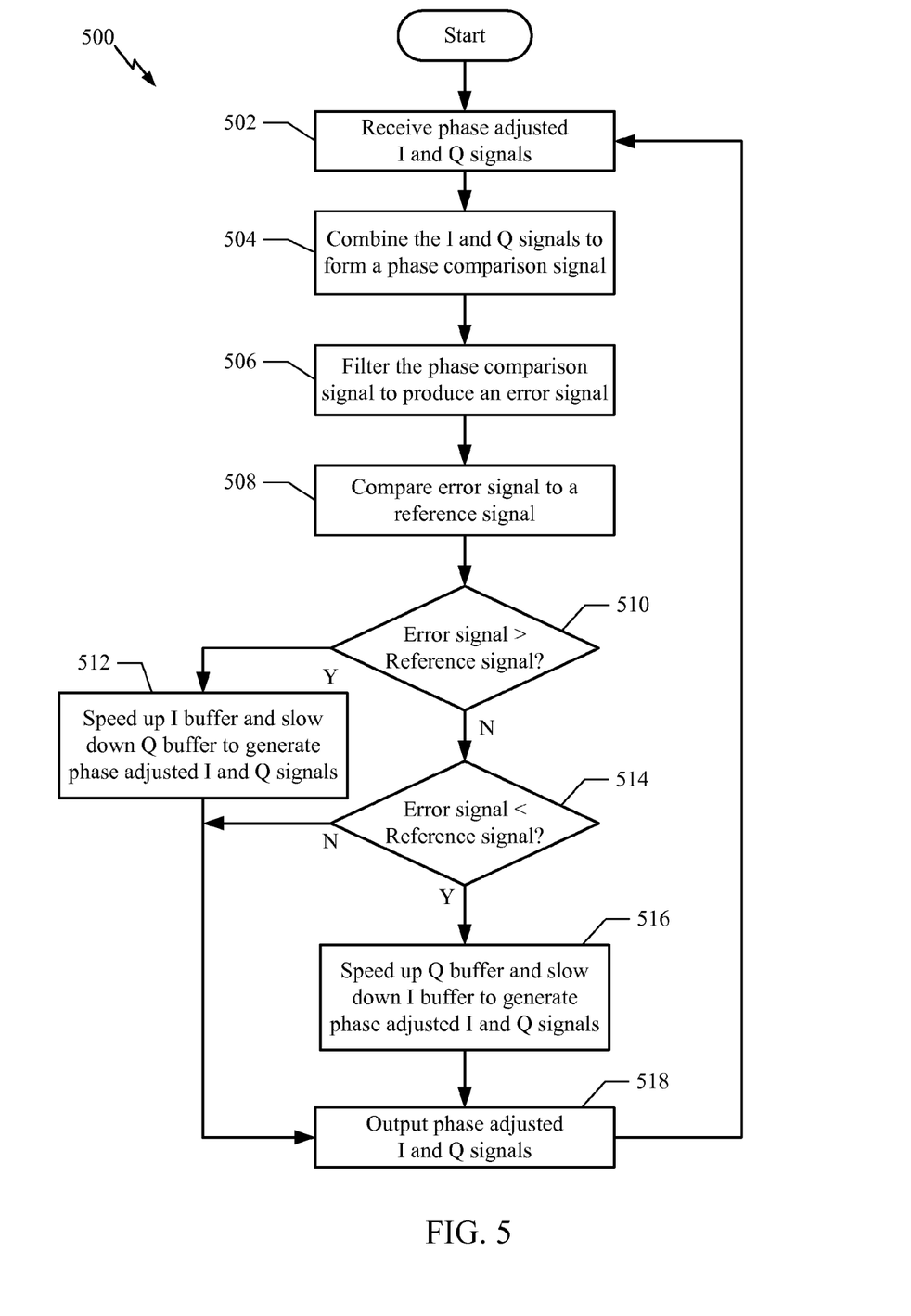
FIG. 5 shows an exemplary method for providing I/Q phase mismatch detection and correction.

FIG. 5 shows an exemplary method 500 for providing I/Q phase mismatch detection and correction. For example, the method 500 is implemented by the phase correction module 300 shown in FIG. 3. It should be noted that the method 500 describes phase mismatch detection and correction with respect to a single-ended configuration, but that it is also possible to modify the method 500 to provide phase mismatch detection and correction with respect to a differential configuration.

At block 502, phase adjusted I and Q signals are received. For example, the method 500 operates continuously to adjust LO generated I and Q signals to produce phase adjusted I and Q signals that correct for any phase mismatches. The phase adjusted I and Q signals are used to detect for any additional phase mismatches that may occur. For example, the LOIP (PA) and LOQP (PA) signals are received from the output of the CMOS buffers 324 and 326. In one implementation, the LOIP (PA) and LOQP (PA) signals are received by the XOR gate 306.

At block 504, the phase adjusted I and Q signals are combined to form a phase comparison signal that is used to detect for any phase mismatches. In one implementation, the LOIP (PA) and LOQP (PA) signals are processed using the XOR gate 306 to produce a pulse train signal having a duty cycle that represents the phase relationship between the two signals.

At block 506, the phase comparison signal is filtered to produce an error signal. For example, pulse train signal is filtered to produce a DC level error signal 312. In one implementation, the pulse train signal is filtered by a low pass filter comprising the resistor 308 and capacitor 310.

At block 508, the DC level error signal is compare to a reference signal. In one implementation, comparators 314 and 316 operate to make this comparison. The reference signal is generated by the resistors 320 and 322 and, in one implementation, is set to have a value of VDD/2.

At block 510, a determination is made as to whether the DC level error signal is greater than the reference signal. In one implementation, comparators 314 and 316 operate to make this determination. If the error signal is greater than the reference signal, the method proceeds to block 512. If the error signal is not greater than the reference signal, the method proceeds to block 514.

At block 512, an I buffer speed is increased and a Q buffer speed is decreased to generate phase adjusted I and Q signals. For example, the LOIP and LOQP signals are input to CMOS buffers 324 and 326, respectively. Each buffer comprises bias transistors that operate to speed up or slow down the operation of the buffer based on received bias signals. In one implementation, the comparators 314 and 316 operate to output complementary bias signals that control the operation of the bias transistors 334, 336, 344, and 346 to control the operation of the buffers 324 and 326. Thus, the bias transistors are biased by the bias signals to increase the speed of the I buffer 324 to advance the LOIP signal and decrease the speed of the Q buffer 326 to delay the LOQP signal.

At block 514, a determination is made as to whether the DC level error signal is less than the reference signal. In one implementation, comparators 314 and 316 operate to make this determination. If the error signal is less than the reference signal, the method proceeds to block 516. If the error signal is not less than the reference signal, the method proceeds to block 518.

At block 516, an I buffer speed is decrease and a Q buffer speed is increase to generate phase adjusted I and Q signals. For example, the LOIP and LOQP signals are input to CMOS buffers 324 and 326, respectively. Each buffer comprises bias transistors that operate to speed up or slow down the operation of the buffer based on received bias signals. In one implementation, the comparators 314 and 316 operate to output complementary bias signals that control the operation of the bias transistors 334, 336, 344, and 346 to control the operation of the buffers 324 and 326. Thus, the bias transistors are biased by the bias signals to increase the speed of the Q buffer 326 to advance the LOQP signal and decrease the speed of the I buffer 324 to delay the LOIP signal.

At block 518, the phase adjusted I and Q signals are output from the appropriate buffers. For example, the LOIP (PA) and LOQP (PA) signals are output from the buffers 324 and 326 for use by other circuitry at a transmitter or receiver, such as a mixer circuit. The LOIP (PA) and LOQP (PA) signals are also input back into the detection circuit 302 to provide for continuous phase detection and correction.

Thus, the method 500 operates to provide for continuous detection and correction of I/Q phase mismatches. It should be noted that the method 500 is just one implementation and that the operations of the method 500 may be rearranged or otherwise modified such that other implementations are possible.

Figure 6:
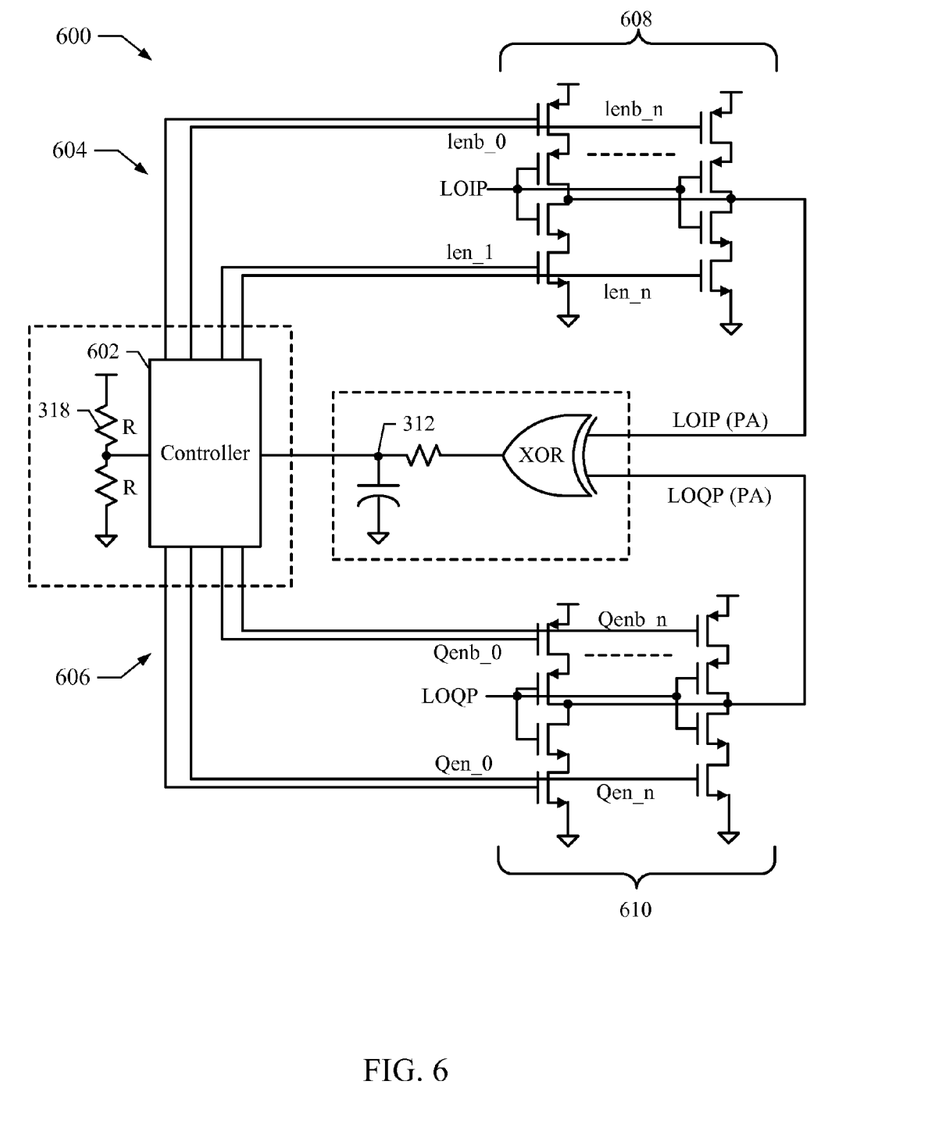
FIG. 6 shows an exemplary I/Q phase correction module.

FIG. 6 shows an exemplary I/Q phase correction module 600 that operates to provide I/Q phase mismatch detection and correction. The module 600 is suitable for use as either of the correction modules 108 or 110 shown in FIG. 1. The module 600 comprises a controller 602 that operates to generate multiple I enable (Ien) signals 604 and Q enable (Qen) signals 606 that are connected to control I buffer group 608 and a Q buffer group 610, respectively.

The buffer groups 608 and 610 comprise a plurality of individual buffers similar to the buffers 324 and 326 that are connected in a parallel fashion so that for each of the buffer groups 608 and 610, all the inputs are connected together and all the outputs are connected together. By enabling more or less of the individual buffers in each group, the buffer groups 608 and 610 are able to advance or delay their input signals to produce phase adjusted output signals.

The controller 602 comprises hardware and/or hardware executing software that operates to generate the enable signals 604, 606 based on the reference signal 318 and the filtered error signal 312. For example, in one implementation, the controller 602 operates to compare the error signal 312 to the reference signal 318 and based on the difference, generates the enable signals 604, 606 to enable more or less of the buffers in the buffer groups 608, 610 and thereby speed up or slow down the LOIP and LOQP signals to correct for phase mismatches. For example, if the error signal 312 is less than the reference signal 318 then the controller 602 operates to enable fewer I buffers in the buffer group 608 so as to slow down its operation and delay the LOIP signal to form the LOIP (PA) signal. The controller 602 also operates to enable more buffers in the buffer group 610 so as to speed up its operation and advance the LOQP signal to form the LOQP (PA) signal. Thus, the controller operates to continuously compare the error signal 312 to the reference signal 318 to adjust the number of individual buffers that are enabled in the buffer groups 608 and 610 to correct for any phase mismatches between the LOIP and LOQP signals.

Figure 7:
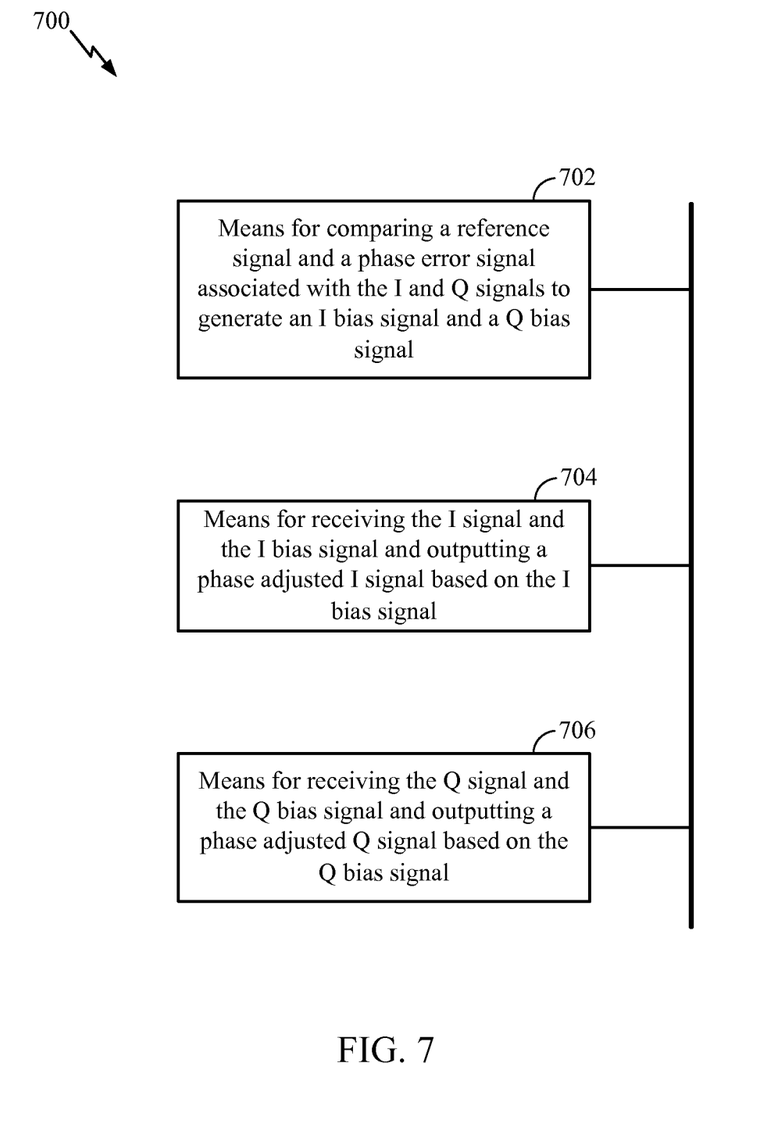
FIG. 7 shows an exemplary I/Q phase correction apparatus.

FIG. 7 shows an exemplary I/Q phase correction apparatus 700 that operates to provide I/Q phase mismatch detection and correction. For example, the phase correction apparatus 700 is suitable for use as either of the I/Q phase correction modules 108 or 110 shown in FIG. 1. In an aspect, the apparatus 700 is implemented by one or more modules configured to provide the functions as described herein. For example, in an aspect, each module comprises hardware and/or hardware executing software.

The apparatus 700 comprises a first module comprising means (702) for comparing a reference signal and a phase error signal associated with I and Q signals to generate an I bias signal and a Q bias signal, which in an aspect comprises the correction circuit 304.

The apparatus 700 also comprises a second module comprising means (704) for receiving the I signal and the I bias signal and outputting a phase adjusted I signal based on the I bias signal, which in an aspect comprises the CMOS buffer 324.

The apparatus 700 also comprises a third module comprising means (707) for receiving the Q signal and the Q bias signal and outputting a phase adjusted Q signal based on the Q bias signal, which in an aspect comprises the CMOS buffer 326.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus to correct a phase mismatch between I and Q signals, the apparatus comprising:
    a correction circuit configured to continuously compare a reference signal and a phase error signal associated with the I and Q signals to generate an I bias signal and a Q bias signal;
    a first CMOS buffer configured to receive the I signal and the I bias signal and output a phase adjusted I signal based on the I bias signal; and
    a second CMOS buffer configured to receive the Q signal and the Q bias signal and output a phase adjusted Q signal based on the Q bias signal.

2. The apparatus of claim 1, the I bias signal comprising an I positive (IP) bias signal that controls the first CMOS buffer to adjust a rising edge of the phase adjusted I signal, and an I negative (IN) bias signal that controls the first CMOS buffer to adjust a falling edge of the phase adjusted I signal.

3. The apparatus of claim 2, the first CMOS buffer comprising an inverter having a first PMOS transistor and a first NMOS transistor, the first PMOS and NMOS transistors comprising gate terminals that are connected to receive the I signal and drain terminals that are connected to output the phase adjusted I signal.

4. The apparatus of claim 3, the first CMOS buffer comprising:
    a second PMOS transistor having a gate terminal connected to the IP bias signal, a source terminal connected to a first supply voltage, and a drain terminal connected to a source terminal of the first PMOS transistor; and
    a second NMOS transistor having a gate terminal connected to the IN bias signal, a source terminal connected to a second supply voltage, and a drain terminal connected to a source terminal of the first NMOS transistor.

5. The apparatus of claim 1, the Q bias signal comprising a Q positive (QP) bias signal that controls the second CMOS buffer to adjust a rising edge of the phase adjusted Q signal, and a Q negative (QN) bias signal that controls the second CMOS buffer to adjust a falling edge of the phase adjusted Q signal.

6. The apparatus of claim 5, the second CMOS buffer comprising a CMOS inverter having a first PMOS transistor and a first NMOS transistor, the first PMOS and NMOS transistors comprising gate terminals that are connected to receive the Q signal and drain terminals that are connected to output the phase adjusted Q signal.

7. The apparatus of claim 6, the second CMOS buffer comprising:
    a second PMOS transistor having a gate terminal connected to the QP bias signal, a source terminal connected to a first supply voltage, and a drain terminal connected to a source terminal of the first PMOS transistor; and
    a second NMOS transistor having a gate terminal connected to the QN bias signal, a source terminal connected to a second supply voltage, and a drain terminal connected to a source terminal of the first NMOS transistor.

8. The apparatus of claim 1, each of the first CMOS buffer and the second CMOS buffer comprising one of a single inverter or multiple inverters connected in a series or parallel chain.

9. The apparatus of claim 1, further comprising a detection circuit comprising:
    a combining circuit configured to combine the phase adjusted I and Q signals to generate a phase comparison signal; and
    a filter configured to filter the phase comparison signal to generate the phase error signal.

10. The apparatus of claim 9, the combining circuit comprising one of an XOR gate or a phase detector.

11. The apparatus of claim 1, the correction circuit comprising:
    a first comparator circuit configured to compare the phase error signal to the reference signal to generate the I bias signal; and
    a second comparator circuit configured to compare the phase error signal to the reference signal to generate the Q bias signal.

12. The apparatus of claim 11, the first and second comparator circuits configured to generate the I bias signal and the Q bias signal so as to control the first and second CMOS buffers to advance the I signal and delay the Q signal if the error signal is greater than the reference signal.

13. The apparatus of claim 11, the first and second comparator circuits configured to generate the I bias signal and the Q bias signal so as to control the first and second CMOS buffers to advance the Q signal and delay the I signal if the error signal is less than the reference signal.

14. The apparatus of claim 1, further comprising a reference generator configured to generate the reference signal to be one half of a supply voltage.

15. The apparatus of claim 1, the correction circuit configured as a single-ended circuit to correct for phase mismatches between single-ended I and Q signals.

16. The apparatus of claim 1, the correction circuit configured as a differential circuit to correct for phase mismatches between differential I and Q signals.

17. The apparatus of claim 1, the first CMOS buffer comprising a first CMOS buffer group having a plurality of individual first buffers that are coupled to output the phase adjusted I signal, and the second CMOS buffer comprising a second CMOS buffer group having a plurality of individual second buffers that are coupled to output the phase adjusted Q signal.

18. The apparatus of claim 17, the correction circuit comprising a controller configured to compare the reference signal and the phase error signal associated with the I and Q signals to generate the I bias signal to comprise a plurality of I enable signals and the Q bias signal to comprise a plurality of Q enable signals.

19. The apparatus of claim 18, the plurality of I enable signals are coupled to the plurality of individual first buffers of the first CMOS buffer group, respectively, to enable selected individual first buffers to produce the phase adjusted I signal, so that as more of the individual first buffers are enabled, the I signal is advanced to produce the phase adjusted I signal.

20. The apparatus of claim 18, the plurality of Q enable signals are coupled to the plurality of individual second buffers of the second CMOS buffer group, respectively, to enable selected individual second buffers to produce the phase adjusted Q signal, so that as more of the individual second buffers are enabled, the Q signal is advanced to produce the phase adjusted Q signal.

21. An apparatus to correct a phase mismatch between I and Q signals, the apparatus comprising:
   means for comparing a reference signal and a phase error signal associated with the I and Q signals to generate an I bias signal and a Q bias signal;
   means for receiving the I signal and the I bias signal and outputting a phase adjusted I signal based on the I bias signal; and
   means for receiving the Q signal and the Q bias signal and outputting a phase adjusted Q signal based on the Q bias signal.

22. The apparatus of claim 21, further comprising means for adjusting a rising edge and a falling edge of the I signal based on the I bias signal to produce the phase adjusted I signal.

23. The apparatus of claim 21, further comprising means for adjusting a rising edge and a falling edge of the Q signal based on the Q bias signal to produce the phase adjusted Q signal.

24. The apparatus of claim 21, further comprising:
   means for combining the phase adjusted I and Q signals to generate a phase comparison signal; and
   means for filtering the phase comparison signal to generate the phase error signal.

25. The apparatus of claim 21, further comprising means for generating the reference signal to be one half of a supply voltage.

26. A method for correcting a phase mismatch between I and Q signals, the method comprising:
   comparing a reference signal and a phase error signal associated with the I and Q signals to generate an I bias signal and a Q bias signal;
   adjusting the I signal based on the I bias signal to produce a phase adjusted I signal;
   adjusting the Q signal based on the Q bias signal to produce a phase adjusted Q signal.

27. The method of claim 26, further comprising adjusting a rising edge and a falling edge of the I signal based on the I bias signal to produce the phase adjusted I signal.

28. The method of claim 26, further comprising adjusting a rising edge and a falling edge of the Q signal based on the Q bias signal to produce the phase adjusted Q signal.

29. The method of claim 26, said comparing comprising:
   combining the phase adjusted I and Q signals to generate a phase comparison signal; and
   filtering the phase comparison signal to generate the phase error signal.

30. The method of claim 26, further comprising generating the reference signal to be one half of a supply voltage.

* * * * *